(12) United States Patent
Lee et al.

(10) Patent No.: US 12,207,523 B2
(45) Date of Patent: Jan. 21, 2025

(54) TRANSPARENT TOUCH DISPLAY APPARATUS

(71) Applicant: LG Display Co., Ltd., Seoul (KR)

(72) Inventors: Hwi Deuk Lee, Gumi-si (KR); Yang Sik Lee, Bucheon-si (KR); Se Eung Lee, Gumi-si (KR); Sang Hyuck Bae, Seoul (KR)

(73) Assignee: LG Display Co., Ltd., Seoul (KR)

( * ) Notice: Subject to any disclaimer, the term of this patent is extended or adjusted under 35 U.S.C. 154(b) by 483 days.

(21) Appl. No.: 17/560,119

(22) Filed: Dec. 22, 2021

(65) Prior Publication Data
US 2022/0208862 A1 Jun. 30, 2022

(30) Foreign Application Priority Data

Dec. 31, 2020 (KR) .................. 10-2020-0189503
Jul. 30, 2021 (KR) .................. 10-2021-0100713

(51) Int. Cl.
*H10K 59/40* (2023.01)
*G06F 3/041* (2006.01)
(Continued)

(52) U.S. Cl.
CPC .......... *H10K 59/40* (2023.02); *G06F 3/0412* (2013.01); *H10K 50/828* (2023.02);
(Continued)

(58) Field of Classification Search
CPC .... H10K 59/40; H10K 59/122; H10K 59/131; H10K 59/126; H10K 59/80518;
(Continued)

(56) References Cited

U.S. PATENT DOCUMENTS

2016/0349899 A1 12/2016 Hwang et al.
2017/0010712 A1* 1/2017 Yoshizumi ............ G06F 3/0443
(Continued)

FOREIGN PATENT DOCUMENTS

CN 103441137 A 12/2013
CN 106997894 A 8/2017
(Continued)

OTHER PUBLICATIONS

Z. Ye et al., "High Precision Active-Matrix Self-Capacitive Touch Panel Based on Fluorinated ZnO Thin-Film Transistor," in Journal of Display Technology, vol. 11, No. 1, pp. 22-29, Jan. 2015, doi: 10.1109/JDT.2014.2357845 (Year: 2015).*

*Primary Examiner* — Sitaramarao S Yechuri
(74) *Attorney, Agent, or Firm* — Seed IP Law Group LLP (57) ABSTRACT

A transparent touch display apparatus includes a light-emitting device on an emission area of a device substrate and a touch electrode on a transmission area of the device substrate. The light-emitting device includes a first electrode, a light-emitting layer and a second electrode. The touch electrode includes the same material as the second electrode. An encapsulating element is disposed on the light-emitting device and the touch electrode. An over-coat layer is disposed between the device substrate and the light-emitting device, and between the device substrate and the touch electrode. A first link wire electrically connected to the second electrode of the light-emitting device and a second link wire electrically connected to the touch electrode are disposed between the device substrate and the over-coat layer.

17 Claims, 6 Drawing Sheets

(51) Int. Cl.
  *H10K 50/828* (2023.01)
  *H10K 59/122* (2023.01)
  *H10K 59/131* (2023.01)
  *H10K 50/818* (2023.01)
  *H10K 59/126* (2023.01)

(52) U.S. Cl.
  CPC ......... *H10K 59/122* (2023.02); *H10K 59/131* (2023.02); *H10K 50/818* (2023.02); *H10K 59/126* (2023.02)

(58) Field of Classification Search
  CPC ........... H10K 59/121; H10K 59/80521; H10K 59/80524; H10K 50/828; H10K 50/818; H10K 2102/3026; G06F 3/0412; G06F 3/04164; G06F 3/0446; G06F 3/0445; G06F 2203/04103; H01L 27/124
  See application file for complete search history.

(56) References Cited

U.S. PATENT DOCUMENTS

| | | |
|---|---|---|
| 2017/0160852 A1 | 6/2017 | Ahn et al. |
| 2017/0192573 A1* | 7/2017 | Kim .................. G06F 3/0412 |
| 2017/0269783 A1 | 9/2017 | Yang et al. |
| 2018/0052552 A1 | 2/2018 | Tsai |
| 2018/0120995 A1 | 5/2018 | Lee et al. |
| 2018/0151627 A1 | 5/2018 | Seo et al. |
| 2018/0175117 A1 | 6/2018 | Lee |
| 2019/0198599 A1 | 6/2019 | Son |
| 2020/0273927 A1 | 8/2020 | Oh et al. |
| 2022/0320064 A1* | 10/2022 | Takahashi ........... H04M 1/0266 |

FOREIGN PATENT DOCUMENTS

| | | |
|---|---|---|
| CN | 109755278 A | 5/2019 |
| JP | 2011118330 | 6/2011 |
| JP | 2018004733 | 1/2018 |
| JP | 2020109634 A | 7/2020 |
| KR | 10-1679977 B1 | 11/2016 |
| KR | 10-2017-0067093 A | 6/2017 |
| KR | 10-2018-0059035 A | 6/2018 |
| KR | 10-2018-0069318 A | 6/2018 |
| TW | 200828640 A | 7/2008 |
| TW | 201442246 A | 11/2014 |
| TW | 201532252 A | 8/2015 |

* cited by examiner

TRANSPARENT TOUCH DISPLAY APPARATUS

CROSS-REFERENCE TO RELATED APPLICATIONS

This application claims the benefit of Korean Patent Applications No. 10-2020-0189503 filed on Dec. 31, 2020, and No. 10-2021-0100713 filed on Jul. 30, 2021, which are hereby incorporated by reference as if fully set forth herein.

BACKGROUND

Technical Field

The present disclosure relates to a transparent touch display apparatus in which a light-emitting device and a touch electrode are disposed on a device substrate including an emission area and a transmission area.

Description of the Related Art

Generally, an electronic appliance, such as a monitor, a TV, a laptop computer and a digital camera, includes a display apparatus capable of realizing an image. For example, the display apparatus may include a plurality of light-emitting devices. Each of the light-emitting devices may emit light displaying a specific color. For example, each of the light-emitting devices may include a light-emitting layer disposed between a first electrode and a second electrode.

The display apparatus may include an emission area in which the light-emitting devices are disposed, and a transmission area disposed outside the light-emitting devices. For example, the display apparatus may be a transparent display apparatus which is recognized as transparent glass when an image is not realized. The transparent display apparatus may be a transparent touch display apparatus which senses a touch of a user and/or a tool to apply a specific signal or drive a specific program. For example, the transparent touch display apparatus may include a touch electrode to sense the touch of the user and/or the tool.

The touch electrode may be disposed on an encapsulating element covering the light-emitting devices. For example, the transparent touch display apparatus may have a structure in which a device substrate on which the light-emitting devices and the encapsulating element are formed is coupled with a touch substrate on which the touch electrode is formed. Thus, in the transparent touch display apparatus, an overall thickness may be increased, a misarrangement of the touch electrode and the light-emitting device may occur, and a process may be complicated.

BRIEF SUMMARY

Accordingly, the present disclosure is directed to a transparent touch display apparatus that substantially obviates one or more problems due to limitations and disadvantages of the related art.

A benefit of the present disclosure is to provide a transparent touch display apparatus capable of increasing a process efficiency by simplifying a structure.

Another benefit of the present disclosure is to provide a transparent touch display apparatus capable of improving touch reliability without the deterioration of the image.

Additional advantages and features of the disclosure will be set forth in part in the description which follows and in part will become apparent to those having ordinary skill in the art upon examination of the following or may be learned from practice of the disclosure. The features and other advantages of the disclosure may be realized and attained by the structure particularly pointed out in the written description and claims hereof as well as the appended drawings.

To achieve these advantages and in accordance with the purpose of the disclosure, as embodied and broadly described herein, there is provided a transparent touch display apparatus comprising a device substrate. The device substrate includes an emission area and a transmission area. An over-coat layer is disposed on the emission area and the transmission area of the device substrate. A pixel electrode is disposed on the over-coat layer of the emission area. An edge of the pixel electrode is covered by a bank insulating layer. An upper electrode is disposed on the bank insulating layer. The upper electrode includes a first electrode region overlapping with the emission area and a second electrode region overlapping with the transmission area. The second electrode region of the upper electrode is spaced away from the first electrode region of the upper electrode. A light-emitting layer is disposed between a portion of the pixel exposed by the bank insulating layer and the first electrode region of the upper electrode. An encapsulating element is disposed on the first electrode region and the second electrode region of the upper electrode. A first link wire and a second link wire are disposed between the device substrate and the over-coat layer. The first link wire is electrically connected to the first electrode region of the upper electrode. The second link wire is electrically connected to the second electrode region of the upper electrode. The second link wire is spaced away from the first link wire.

A separating partition may be disposed on the bank insulating layer. The separating partition may include a side having a shape of reverse taper. The separating partition may be disposed between the first electrode region and the second electrode region of the upper electrode.

The separating partition may be disposed between the emission area and the transmission area.

The second electrode region of the upper electrode may include the same material as the first electrode region of the upper electrode.

The second link wire may include the same material as the first link wire.

The second link wire may be disposed on the same layer as the first link wire.

A thin film transistor may be disposed between the device substrate and the over-coat layer. The thin film transistor may be electrically connected to the pixel electrode. A light-blocking pattern may be disposed between the device substrate and a semiconductor pattern of the thin film transistor. The first link wire and the second link wire may be disposed on the same layer as the light-blocking pattern.

A color filter and a black matrix may be disposed on the encapsulating element. The color filter may overlap the emission area. The black matrix may be disposed side by side the color filter. The color filter and the black matrix may be disposed outside the transmission area.

The second electrode region of the upper electrode may be disposed side by side with the first electrode region of the upper electrode in a first direction. The first electrode region of the upper electrode may extend in a second direction perpendicular to the first direction.

The upper electrode may include a third electrode region which is spaced away from the first electrode region and the second electrode region. The first electrode region may be disposed between the second electrode region and the third electrode region. The third electrode region may be electrically connected to a third link wire which is spaced away from the first link wire and the second link wire. The second electrode region and the third electrode region may extend in the second direction.

In another embodiment, there is provided a transparent touch display apparatus comprising a device substrate. A light-emitting device is disposed on an emission area of the device substrate. The light-emitting device includes a first electrode, a light-emitting layer and a second electrode, which are sequentially stacked. A touch electrode is disposed on a transmission area of the device substrate. The touch electrode includes the same material as the second electrode of the light-emitting device. An upper over-coat layer is disposed between the device substrate and the first electrode of the light-emitting device. The upper over-coat layer extends between the device substrate and the touch electrode. A first link wire and a second link wire are disposed between the device substrate and the upper over-coat layer. The first link wire is electrically connected to the second electrode of the light-emitting device. The second link wire is electrically connected to the touch electrode. The second link wire extends parallel to the first link wire.

An encapsulating element may be disposed on the second electrode of the light-emitting device and the touch electrode.

A thin film transistor may be disposed between the device substrate and the upper over-coat layer. The thin film transistor may be electrically connected to the first electrode of the light-emitting device. A lower over-coat layer may be disposed between the thin film transistor and the upper over-coat layer. The first link wire and the second link wire may be disposed between the lower over-coat layer and the upper over-coat layer.

A connecting electrode may be disposed between the lower over-coat layer and the upper over-coat layer. The connecting electrode may electrically connect the first electrode of the light-emitting device to the thin film transistor. The first link wire and the second link wire may include the same material as the connecting electrode.

A bank insulating layer covering an edge of the first electrode may extend between the upper over-coat layer and the touch electrode. A first intermediate link and a second intermediate link may be disposed between the upper over-coat layer and the bank insulating layer. The first intermediate link may electrically connect the second electrode of the light-emitting device to the first link wire. The second intermediate link may electrically connect the touch electrode to the second link wire. The first link wire and the second link wire may include the same material as the first electrode of the light-emitting device.

The touch electrode may be disposed side by side with the second electrode of the light-emitting device in a first direction. The second electrode of the light-emitting device may extend in a second direction perpendicular to the first direction. The second electrode may include a protruding region which is extended in the first direction at the outside of the touch electrode. The first intermediate link may be electrically connected to the protruding region of the second electrode.

The bank insulating layer may include a first intermediate contact hole exposing at least a portion of the first intermediate link and a second intermediate contact hole exposing at least a portion of the second intermediate link. The second intermediate contact hole may be disposed side by side with the first intermediate contact hole in the second direction.

In accordance with various embodiments, a transparent touch display apparatus includes a light-emitting device, a touch electrode, an upper over-coat layer, a first link wire, and a second link wire. The light-emitting device is on an emission area of a device substrate. The touch electrode is on a transmission area of the device substrate, and includes the same material as an upper electrode of the light-emitting device. The upper over-coat layer is between the device substrate and a pixel electrode of the light-emitting device. The first link wire is between the device substrate and the upper over-coat layer, and is in contact with the upper electrode of the light-emitting device through the upper over-coat layer. The second link wire is between the device substrate and the upper over-coat layer, and is in contact with the touch electrode through the upper over-coat layer. The second link wire is in the same layer as the first link wire.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 1:
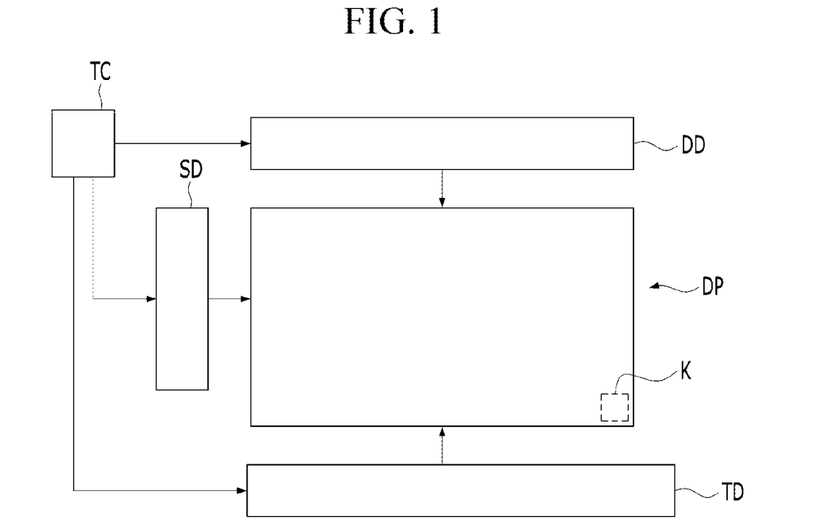
FIG. 1 is a view schematically showing a transparent touch display apparatus according to one or more embodiments of the present disclosure.

FIG. 1 is a view schematically showing a transparent touch display apparatus according to one or more embodiments of the present disclosure.

Referring to FIG. 1, the transparent touch display apparatus according to embodiment of the present disclosure may include a display panel DP and driving parts DD, SD, TC and TD. The display panel DP may realize an image provided to a user. The driving parts DD, SD, TC and TD may provide various signals for realizing the image to the display panel DP. For example, the driving parts DD, SD, TC and TD may include a data driver DD applying a data signal to the display panel DP, a scan driver SD applying a scan signal to the display panel DP, and a timing controller TC. The timing controller TC may control the data driver DD and the scan driver SD. For example, the timing controller TC may apply a digital video data and a source timing control signal to the data driver DD, and apply clock signals, reverse clock signals and start signals to the scan driver SD. The driving parts DD, SD, TD, TC may be driving circuits, and may be referred to as the driving circuits DD, SD, TD, TC.

Figure 2:
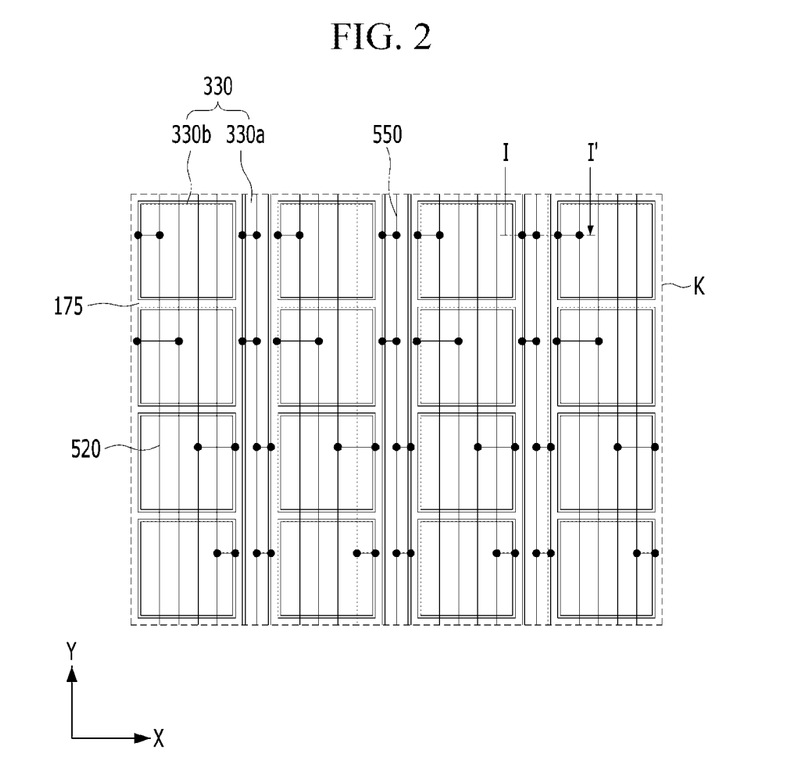
FIG. 2 is an enlarged view of K region in FIG. 1.
Figure 3:
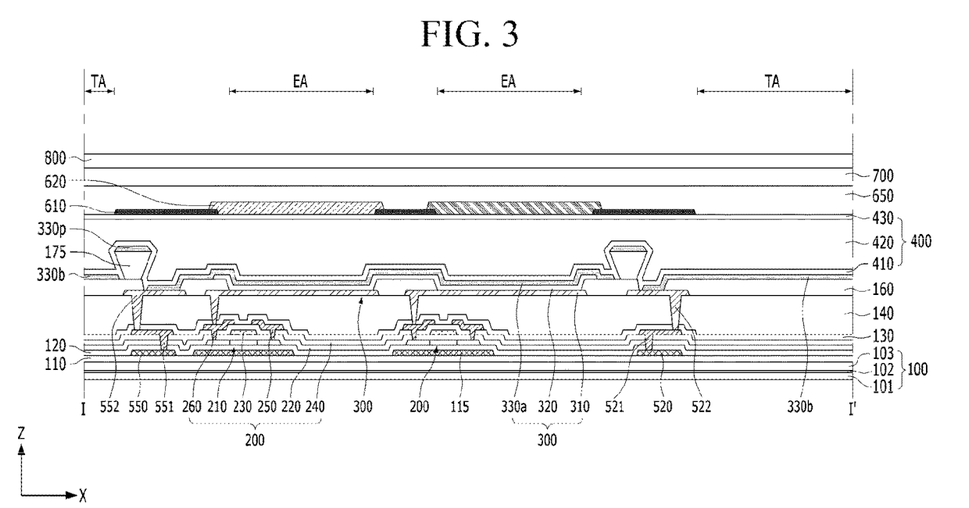
FIG. 3 is a view taken along I-I' of FIG. 2.

FIG. 2 is an enlarged view of K region in FIG. 1. FIG. 3 is a view taken along I-I' of FIG. 2.

Referring to FIGS. 1 to 3, the display panel DP of the transparent touch display apparatus according to the embodiment of the present disclosure may include a device substrate 100. The device substrate 100 may have a multi-layer structure. For example, the device substrate 100 may have a stacked structure of a first substrate layer 101, a substrate insulating layer 102 and a second substrate layer 103. The second substrate layer 103 may include the same material as the first substrate layer 101. For example, the first substrate layer 101 and the second substrate layer 103 may include a polymer material, such as poly-imide (PI). The substrate insulating layer 102 may include an insulating material. For example, the substrate insulating layer 102 may include an inorganic insulating material, such as silicon oxide (SiO) and silicon nitride (SiN). Thus, in the transparent touch display apparatus according to the embodiment of the present disclosure, the device substrate 100 may have high flexibility. Therefore, in the display panel DP of the touch display apparatus according to the embodiment of the present disclosure, the damage of the device substrate 100 due to an external impact and/or bending may be prevented.

Driving circuits may be disposed on the device substrate 100. Each of the driving circuits may be electrically connected to the driving parts DD, SD, TC and TD. For example, each of the driving circuits may be electrically connected to the scan driver SD by scan line, and be electrically connected to the data driver DD by data line. Each of the driving circuits may generate a driving current corresponding to the data signal according to the scan signal. Each of the driving circuits may include at least one thin film transistor 200. The thin film transistor 200 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous silicon (a-Si) and/or polycrystalline silicon (poly-Si). The semiconductor pattern 210 may be an oxide semiconductor. For example, the semiconductor pattern 210 may include a metal oxide, such as IGZO. The semiconductor pattern 210 may include a source region, a drain region and a channel region. The channel region may be disposed between the source region and the drain region. The source region and the drain region may have a lower resistance than the channel region. For example, the source region and the drain region may include a conductorized region of the oxide semiconductor.

The gate insulating layer 220 may be disposed on the semiconductor pattern 210. The gate insulating layer 220 may extend beyond the semiconductor pattern 210. For example, a side of the semiconductor pattern 210 may be covered by the gate insulating layer 220. The gate insulating layer 220 may include an insulating material. For example, the gate insulating layer 220 may include an inorganic insulating material, such as silicon oxide (SiO) and silicon nitride (SiN). The gate insulating layer 220 may include a material having a high dielectric constant. For example, the gate insulating layer 220 may include a high-K material, such as hafnium oxide (HfO). The gate insulating layer 220 may have a multi-layer structure.

The gate electrode 230 may be disposed on the gate insulating layer 220. The gate electrode 230 may include a conductive material. For example, the gate electrode 230 may include a metal, such as aluminum (Al), titanium (Ti), copper (Cu), chrome (Cr), molybdenum (Mo) and tungsten (W). The gate electrode 230 may be insulated from the semiconductor pattern 210 by the gate insulating layer 220. The gate electrode 230 may overlap the channel region of the semiconductor pattern 210. For example, the channel region of the semiconductor pattern 210 may have electrical conductivity corresponding to a voltage applied to the gate electrode 230.

The interlayer insulating layer 240 may be disposed on the gate electrode 230. The interlayer insulating layer 240 may extend beyond the gate electrode 230. For example, a side of the gate electrode 230 may be covered by the interlayer insulating layer 240. The interlayer insulating layer 240 may be in direct contact with the gate insulating layer 220 at the outside of the gate electrode 230. The interlayer insulating layer 240 may include an insulating material. The interlayer insulating layer 240 may include an inorganic insulating material. For example, the interlayer insulating layer 240 may include silicon oxide (SiO).

The source electrode 250 may be disposed on the interlayer insulating layer 240. The source electrode 250 may include a conductive material. For example, the source electrode 250 may include a metal, such as aluminum (Al), titanium (Ti), copper (Cu), chrome (Cr), molybdenum (Mo)

and tungsten (W). The source electrode 250 may be insulated from the gate electrode 230 by the interlayer insulating layer 240. For example, the source electrode 250 may include a material different from the gate electrode 230. The source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may include a portion overlapping with the source region of the semiconductor pattern 210. For example, the source electrode 250 may be in direct contact with the source region of the semiconductor pattern 210 in the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chrome (Cr), molybdenum (Mo) and tungsten (W). The drain electrode 260 may be insulated from the gate electrode 230 by the interlayer insulating layer 240. For example, the drain electrode 260 may include a material different from the gate electrode 230. The drain electrode 260 may include the same material as the source electrode 250. The drain electrode 260 may be electrically connected to the drain region of the semiconductor pattern 210. The drain electrode 260 may be spaced away from the source electrode 250. For example, the gate insulating layer 220 and the interlayer insulating layer 240 may include a drain contact hole partially exposing the drain region of the semiconductor pattern 210. The drain electrode 260 may include a portion overlapping with the drain region of the semiconductor pattern 210. For example, the drain electrode 260 may be in direct contact with the drain region of the semiconductor pattern 210 in the drain contact hole.

A first buffer layer 110 may be disposed between the device substrate 100 and the driving circuits. The first buffer layer 110 may prevent pollution due to the device substrate 100 in a process of forming the thin film transistors 200. For example, an upper surface of the device substrate 100 toward the thin film transistors 200 may be completely covered by the first buffer layer 110. The first buffer layer 110 may include an insulating material. For example, the first buffer layer 110 may include an inorganic insulating material, such as silicon oxide (SiO) and silicon nitride (SiN). The first buffer layer 110 may have a multi-layer structure.

A light-blocking pattern 115 may be disposed between the first buffer layer 110 and each thin film transistor 200. The light-blocking pattern 115 may prevent characteristics change of each thin film transistor 200 due to external light. For example, the light-blocking pattern 115 may include a portion overlapping with the semiconductor pattern 210 of each thin film transistor 200. The light-blocking pattern 115 may include a material that blocks or absorbs the light. For example, the light-blocking pattern 115 may include a metal, such as aluminum (Al), silver (Ag) and copper (Cu). The light-blocking pattern 115 may have a multi-layer structure. For example, the light-blocking pattern 115 may have a structure in which a layer made of a metal is disposed between layers made of a transparent metal oxide, such as ITO and IZO. Thus, in the display panel DP of the transparent touch display apparatus according to the embodiment of the present disclosure, the characteristics change of each thin film transistor 200 due to external light may be effectively prevented.

The light-blocking pattern 115 may be insulated from the semiconductor pattern 210 of each thin film transistor 200. For example, a second buffer layer 120 may be disposed between the light-blocking pattern 115 and the semiconductor pattern 210 of each thin film transistor 200. The second buffer layer 120 may extend beyond the light-blocking pattern 115. For example, a side of the light-blocking pattern 115 may be covered by the second buffer layer 120. The second buffer layer 120 may be in direct contact with the first buffer layer 110 at the outside of the light-blocking pattern 115. The second buffer layer 120 may include an insulating material. For example, the second buffer layer 120 may include an inorganic insulating material, such as silicon oxide (SiO) and silicon nitride (SiN). The second buffer layer 120 may include the same material as the first buffer layer 110.

A lower passivation layer 130 may be disposed on the driving circuits. The lower passivation layer 130 may prevent the damage of the driving circuits due to the external impact and moisture. For example, an upper surface of each thin film transistor 200 opposite to the device substrate 100 may be covered by the lower passivation layer 130. The lower passivation layer 130 may include an insulating material. For example, the lower passivation layer 130 may include an inorganic insulating material, such as silicon oxide (SiO) and silicon nitride (SiN). The lower passivation layer 130 may be a single layer having a constant thickness.

A lower over-coat layer 140 may be disposed on the lower passivation layer 130. The lower over-coat layer 140 may remove a thickness difference due to the driving circuits. For example, a thickness difference due to the thin film transistors 200 may be removed by the lower over-coat layer 140. An upper surface of the lower over-coat layer 140 opposite to the device substrate 100 may be a flat surface. The lower over-coat layer 140 may include an insulating material. The lower over-coat layer 140 may include a same or similar material as the lower passivation layer 130. For example, the lower over-coat layer 140 may include an organic insulating material.

The pixel electrodes 310 may be disposed on the lower over-coat layer 140. Each of the pixel electrodes 310 may be spaced away from adjacent pixel electrode 310. Each of the pixel electrodes 310 may be electrically connected to one of the driving circuits. For example, the lower passivation layer 130 and the lower over-coat layer 140 may include electrode contact holes partially exposing the thin film transistor 200 of each driving circuit. Each of the pixel electrodes 310 may be electrically connected to the corresponding thin film transistor 200 through one of the electrode contact holes. The pixel electrodes 310 may include a conductive material. The pixel electrodes 310 may include a material having high reflectance. For example, the pixel electrodes 310 may include a metal, such as aluminum (Al) and silver (Ag). The pixel electrodes 310 may have a multi-layer structure. For example, each of the pixel electrodes 310 may have a structure in which a reflective electrode made of a metal is disposed between transparent electrodes made of a transparent conductive material, such as ITO and IZO.

A bank insulating layer 160 may be disposed in a space between adjacent pixel electrodes 310. Each of the pixel electrodes 310 may be insulated from adjacent pixel electrode 310 by the bank insulating layer 160. For example, the bank insulating layer 160 may cover an edge of each pixel electrode 310. The bank insulating layer 160 may be disposed on the lower over-coat layer 140. The bank insulating layer 160 may extend beyond the pixel electrodes 310. For example, the bank insulating layer 160 may be in direct contact with the lower over-coat layer 140 between the pixel electrodes 310. The bank insulating layer 160 may include an insulating material. For example, the bank insulating layer 160 may include an organic insulating material. The bank insulating layer 160 may include a material different from the lower over-coat layer 140.

Light-emitting layers 320 may be disposed on a portion of each pixel electrode 310 exposed by the bank insulating layer 160, respectively. The light-emitting layers 320 may generate light displaying a specific color. For example, a portion of each pixel electrode 310 exposed by the bank insulating layer 160 may be defined as an emission area EA. For example, the bank insulating layer 160 may laterally surround each emission area EA. The light-emitting layers 320 may include an emission material layer (EML) including an emission material. The emission material may include an organic material, an inorganic material or a hybrid material. For example, the display panel DP of the transparent touch display apparatus according to the embodiment of the present disclosure may be an organic light-emitting display panel including an organic emission material. Each of the light-emitting layers 320 may have a multi-layer structure. For example, each of the light-emitting layers 320 may include at least one of a hole injection layer (HIL), a hole transmitting layer (HTL), an electron transmitting layer (ETL) and an electron injection layer (EIL). Thus, in the display panel DP of the transparent touch display apparatus according to the embodiment of the present disclosure, the luminous efficiency of each light-emitting layer 320 may be increased.

The device substrate 100 may include transmission areas TA disposed outside the emission areas EA which are defined by (e.g., laterally surrounded by) the bank insulating layer 160. The external light may pass through the transmission areas TA of the device substrate 100. For example, the display panel DP of the transparent touch display apparatus according to the embodiment of the present disclosure may be recognized as transparent glass, when the image is not realized. For example, no image may be displayed when the transparent touch display apparatus is not powered, or is in a standby mode (e.g. power on, but not displaying an image). In another example, the display panel DP may present as transparent glass when an image is displayed in which most or all pixels are driven with a black value (e.g., luminance substantially equal to or equal to zero). The emission areas EA and the transmission areas TA may be repeatedly arranged in a first direction X. For example, in the display panel DP of the transparent touch display apparatus according to the embodiment of the present disclosure, a pair of the emission area EA and the transmission area TA may be repeatedly arranged in the first direction X. Each of the transmission areas TA may have a size larger than each of the emission areas EA. For example, each of the transmission areas TA may extend in a second direction Y perpendicular to the first direction X. The emission areas EA may be disposed side by side in the second direction Y. For example, in the display panel DP of the transparent touch display apparatus according to the embodiment of the present disclosure, the arrangement of the emission areas EA between adjacent transmission areas TA may have a matrix shape in the first direction X and the second direction Y.

The first buffer layer 110, the second buffer layer 120, the lower passivation layer 130, the lower over-coat layer 140, the bank insulating layer 160 and the gate insulating layer 220 and the interlayer insulating layer 240 of each thin film transistor 200 may extend onto the transmission areas TA of the device substrate 100. The light-blocking pattern 115 and conductive layers of each driving circuit may be disposed outside the transmission areas TA. For example, the semiconductor pattern 210, the gate electrode 230, the source electrode 250 and the drain electrode 260 of each thin film transistor 200 may be disposed outside the transmission areas TA. Thus, in the display panel DP of the transparent touch display apparatus according to the embodiment of the present disclosure, the degradation of transmittance due to the light-blocking pattern 115 and the driving circuits may be prevented.

An upper electrode 330 may be disposed on the bank insulating layer 160 and the light-emitting layers 320. The upper electrode 330 may include a conductive material. The upper electrode 330 may include a material different from the pixel electrodes 310. The upper electrode 330 may have a transmittance higher than each pixel electrode 310. For example, the upper electrode 330 may be a transparent electrode made of a transparent conductive material, such as ITO and IZO. The upper electrode 330 may include first electrode regions 330a overlapping with the emission areas EA and second electrode regions 330b overlapping with the transmission areas TA.

Each of the light-emitting layer 320 may generate light having luminance corresponding to a voltage difference between the corresponding pixel electrode 310 and the corresponding first electrode region 330a of the upper electrode 330. For example, the pixel electrode 310, the light-emitting layer 320 and the first electrode region 330a of the upper electrode 330, which are sequentially stacked on the lower over-coat layer 140 of each emission area EA may constitute a light-emitting device 300. The pixel electrode 310 and the first electrode region 330a of the upper electrode 300, which are disposed on each emission area EA may function as a first electrode and a second electrode of the corresponding light-emitting device 300, respectively. Each of the driving circuit may provide the driving current to one of the light-emitting devices 300. For example, the pixel electrode 310 of each light-emitting device 300 may be electrically connected to the drain electrode 260 of the corresponding thin film transistor 200 through one of the electrode contact holes. The light generated from the light-emitting layer 320 of each emission area EA may be emitted to the outside through the corresponding first electrode region 330a of the upper electrode 330. For example, in the display panel DP of the transparent touch display apparatus according to the embodiment of the present disclosure, the image by the light-emitting devices 300 may be realized on the upper electrode 330. It should be understood that "sequentially stacked" includes the meaning of the light-emitting layer 320 being on (e.g., in contact with an upper surface of) the pixel electrode 310, and the first electrode region 330a being on (e.g., in contact with an upper surface of) the light-emitting layer 320. For example, the pixel electrode 310 may be most proximal the device substrate 100, followed by the light-emitting layer 320, followed by the first electrode region 330a, as illustrated in FIG. 3.

The same voltage may be applied to the first electrode region 330a of each of the light-emitting devices 300, which are disposed between adjacent transmission areas TA. For example, the first electrode regions 330a of the light-emitting devices 300 disposed between adjacent transmission areas TA may be electrically connected to each other. The first electrode regions 330a of the light-emitting devices 300 disposed between adjacent transmission areas TA may include the same material. For example, each first electrode region 330a of the upper electrode 330 may extend in the first direction X and the second direction Y between the transmission areas TA. The first electrode regions 330a of the light-emitting devices 300 disposed between adjacent transmission areas TA may be in contact with each other. The light-emitting layer 320 of each light-emitting device 300 may extend along the first electrode region 330a of the corresponding light-emitting device 300. For example, the light-emitting layers 320 of the light-emitting devices 300 disposed between adjacent transmission areas TA may include the same material. The light-emitting devices 300 disposed between adjacent transmission areas TA may emit the light of the same wavelength.

The second electrode regions 330b of the upper electrode 330 may be spaced away from the first electrode region 330a of the upper electrode 330. For example, the second electrode regions 330b of the upper electrode 330 may be separated from the first electrode regions 330a of the upper electrode 330 in the first direction X. For example, a separating partition 175 may be disposed on the bank insulating layer 160 between the first electrode regions 330a and the second electrode regions 330b of the upper electrode 330. The separating partition 175 may include a side having a shape of reverse taper. Thus, in the display panel DP of the transparent touch display apparatus according to the embodiment of the present disclosure, the first electrode regions 330a and the second electrode regions 330b of the upper electrode 330 which are separated from each other may be simultaneously formed without additional patterning process. For example, an electrode pattern 330p including the same material as the first electrode regions 330a and the second electrode regions 330b may be disposed on an upper surface of the separating partition 175 opposite to the device substrate 100. The second electrode regions 330b of the upper electrode 330 may include the same material as the first electrode regions 330a of the upper electrode. The separating partition 175 may be disposed between the emission areas EA and the transmission areas TA. For example, the separating partition 175 may extend parallel to the first electrodes regions 330a of the upper electrode 330 in the second direction Y. Therefore, in the display panel DP of the transparent touch display apparatus according to the embodiment of the present disclosure, the process efficiency may be improved.

The separating partition 175 may include an insulating material. For example, the separating partition 175 may include an organic insulating material and/or an inorganic insulating material. The separating partition 175 may have a multi-layer structure. The separating partition 175 may have a stacked structure of layers, which have an etch selectivity. For example, the separating partition 175 may have a stacked structure of a layer made of an organic insulating material and a layer made of an inorganic insulating material.

A plurality of the second electrode regions 330b may be disposed on each transmission area TA. For example, each of the second electrode regions 330b of the upper electrode 330 may have a block shape. Each of the second electrode regions 330b may be spaced away from the second electrode regions 330b which are disposed adjacent in the first direction X and the second direction Y on each transmission area TA. The separating partition 175 may be disposed between the second electrode regions 330b on each transmission area TA. Thus, in the display panel DP of the transparent touch display apparatus according to the embodiment of the present disclosure, the second electrode regions 330b which have a block shape may be formed on each transmission area TA without additional patterning process.

First link wires 550 may be disposed between the device substrate 100 and the lower over-coat layer 140. For example, the first link wires 550 may be disposed between the first buffer layer 110 and the second buffer layer 120. The first link wires 550 may be disposed on the same layer as the light-blocking pattern 115. The first link wires 550 may be spaced away from the light-blocking pattern 115. The first link wires 550 may include a conductive material. For example, the first link wires 550 may include a metal. The first link wires 550 may include the same material as the light-blocking pattern 115. For example, the first link wires 550 may be simultaneously formed with the light-blocking pattern 115. The first link wires 550 may have the same structure as the light-blocking pattern 115.

A voltage applied to each first electrode region 330a of the upper electrode 330 may be provided by one of the first link wires 550. For example, each of the first link wires 550 may be electrically connected to one of the first electrode regions 330a of the upper electrode 330. Each of the first link wires 550 may be electrically connected to the corresponding first electrode region 330a of the upper electrode 330 by at least one of conductive layers between the first buffer layer 110 and the bank insulating layer 160. For example, first lower intermediate links 551 may be disposed between the inter-layer insulating layer 240 and the lower passivation layer 130, first upper intermediate links 552 may be disposed between the lower over-coat layer 140 and the bank insulating layer 160, and each of the first link wires 550 may be connected to the corresponding first electrode region 330a of the upper electrode 330 by one of the first lower intermediate links 551 and one of the first upper intermediate links 552. The first lower intermediate links 551 may include the same material as the source electrode 250 and the drain electrode 260 of each thin film transistor 200. The first upper intermediate links 552 may include the same material as the pixel electrodes 310.

The first link wires 550 may be disposed between the emission areas EA and the transmission areas TA. For example, the first link wires 550 may include a portion overlapping with the separating partition 175. The first link wires 550 may extend in the second direction Y. The first lower intermediate links 551 and the first upper intermediate links 552 may be disposed between the emission areas EA and the transmission areas TA. For example, the first lower intermediate links 551 and the first upper intermediate links 552 may be stacked between the first link wires 550 and the separating partition 175. The bank insulating layer 160 may include first upper contact holes exposing a portion of each first upper intermediate link 552 which overlaps the separating partition 175. Each of the first electrode regions 330a of the upper electrode 330 may be in direct contact with the corresponding first upper intermediate link 552 through one of the first upper contact holes. Thus, in the display panel DP of the transparent touch display apparatus according to the embodiment of the present disclosure, decreasing the size of the emission areas EA and the transmission areas TA due to the first link wires 550, the first lower intermediate links 551 and the first upper intermediate links 552 for applying a voltage to each first electrode region 330a of the upper electrode 330 may be prevented. Therefore, in the display panel DP of the transparent touch display apparatus according to the embodiment of the present disclosure, the deterioration of the image and degradation of the transmittance may be prevented.

Second link wires 520 may be disposed between the device substrate 100 and the lower over-coat layer 140. For example, the second link wires 520 may be disposed between the first buffer layer 110 and the second buffer layer 120. The second link wires 520 may be disposed on the same layer as the light-blocking pattern 115 and the first link wires 550. The second link wires 520 may be spaced away from the light-blocking pattern 115 and the first link wires 550. The second link wires 520 may include a conductive material. For example, the second link wires 520 may include a metal. The second link wires 520 may include the same material as the first link wires 550. For example, the second link wires 520 may be simultaneously formed with the first link wires 550. The second link wires 520 may have the same structure as the first link wires 550.

Each second electrode region 330b of the upper electrode 330 may be electrically connected to one of the second link wires 520. Thus, in the display panel DP of the transparent touch display apparatus according to the embodiment of the present disclosure, the second electrode regions 330b of the upper electrode 330 may function differently from the first electrode regions 330a of the upper electrode 330. Each of the second link wires 520 may be electrically connected to the corresponding second electrode region 330b of the upper electrode 330 by at least one of conductive layers which are disposed between the first buffer layer 110 and the bank insulating layer 160. For example, second lower intermediate links 521 may be disposed between the interlayer insulating layer 240 and the lower passivation layer 130, second upper intermediate links 522 may be disposed between the lower over-coat layer 140 and the bank insulating layer 160, and each of the second link wires 520 may be connected to the corresponding second electrode region 330b of the upper electrode 330 through one of the second lower intermediate links 521 and one of the second upper intermediate links 522. The second lower intermediate links 521 may include the same material as the first lower intermediate links 551. The second upper intermediate links 522 may include the same material as the first upper intermediate links 552.

The second link wires 520 may be disposed between the emission areas EA and the transmission areas TA. For example, the second link wires 520 may include a portion overlapping with the separating partition 175. The second link wires 520 may extend in the second direction Y. For example, the second link wires 520 may extend parallel to the first link wires 550. The second lower intermediate links 521 and the second upper intermediate links 522 may be disposed between the emission areas EA and the transmission areas TA. For example, the second lower intermediate links 521 and the second upper intermediate links 522 may be stacked between the second link wires 520 and the separating partition 175. The bank insulating layer 160 may include second upper contact holes exposing a portion of each second upper intermediate link 522, which overlaps the separating partition 175. Each second electrode region 330b of the upper electrode 330 may be in direct contact with the corresponding second upper intermediate link 522 through one of the second upper contact holes. Thus, in the display panel DP of the transparent touch display apparatus according to the embodiment of the present disclosure, decreasing the size of the emission areas EA and the transmission areas TA due to the second link wires 520, the second lower intermediate links 521 and the second upper intermediate links 522 may be prevented. Therefore, in the display panel DP of the transparent touch display apparatus according to the embodiment of the present disclosure, the deterioration of the image and degradation of the transmittance may be prevented.

The transparent touch display apparatus according to the embodiment of the present disclosure may sense a touch of a user and/or a tool. For example, the driving parts DD, SD, TC and TD may include a touch sensing part TD, and the second link wires 520 may electrically connect each second electrode region 330b of the upper electrode 330 to the touch sensing part TD. Thus, in the display panel DP of the transparent touch display apparatus according to the embodiment of the present disclosure, the second electrode regions 330b of the upper electrode 330 may function as touch electrode. That is, in the display panel DP of the transparent touch display apparatus according to the embodiment of the present disclosure, the touch electrode for sensing the touch of the user and/or the tool may be simultaneously formed with the light-emitting devices 300. Therefore, in the display panel DP of the transparent touch display apparatus according to the embodiment of the present disclosure, a process may be simplified, and a misarrangement of the light-emitting devices 300 and the second electrode regions 330b of the upper electrode, which function as touch electrodes, may be prevented.

And, in the display panel DP of the transparent touch display apparatus according to the embodiment of the present disclosure, the first electrode regions 330a of the upper electrode 330, which function as the second electrode of each light-emitting device 300 may be disposed on the emission areas EA of the device substrate 100, and the second electrode regions 330b of the upper electrode 330, which function as the touch electrode may be disposed on the transmission areas TA of the device substrate 100. Thus, in the display panel DP of the transparent touch display apparatus according to the embodiment of the present disclosure, realizing the image by the light-emitting devices 300 and sensing the touch of the user and/or the tool may be simultaneously performed. Therefore, in the transparent touch display apparatus according to the embodiment of the present disclosure, the reliability for sensing the touch may be improved without the deterioration of the image.

An encapsulating element 400 may be disposed on the first electrode regions 330a and the second electrode regions 330b of the upper electrode 330. The encapsulating element 400 may prevent the damage of the light-emitting devices 300 due to the external impact and moisture. The encapsulating element 400 may have a multi-layer structure. For example, the encapsulating element 400 may include a first encapsulating layer 410, a second encapsulating layer 420 and the third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may include an inorganic insulating material, and the second encapsulating layer 420 may include an organic insulating material. Thus, in the display panel DP of the transparent touch display apparatus according to the embodiment of the present disclosure, the damage of the light-emitting devices 300 due to the external impact and moisture may be effectively prevented. A thickness difference due to the light-emitting devices 300 and the separating partitions 175 may be removed by the second encapsulating layer 420. For example, an upper surface of the encapsulating element 400 opposite to the device substrate 100 may be a flat surface. The side of each separating partition 175 having reverse taper may be surrounded by the encapsulating element 400. Is should be understood that "sequentially stacked" includes the meaning that the first encapsulating layer 410 is on (e.g. in contact with an upper surface of) the upper electrode 330, the second encapsulating layer 420 is on (e.g., in contact with an upper surface of) the first encapsulating layer 410, and the third encapsulating layer 430 is on (e.g., in contact with an upper surface of) the second encapsulating layer 420. For example, the first encapsulating layer 410 is most proximal the device substrate 100, followed by the second encapsulating layer 420, followed by the third encapsulating layer 430.

A black matrix 610 and color filters 620 may be disposed side by side on the encapsulating element 400. Each of the color filter 620 may overlap one of the emission areas EA. The color filter 620 on each emission area EA may include a material different from the color filter on adjacent emission area EA. Thus, in the display panel DP of the transparent touch display apparatus according to the embodiment of the present disclosure, the emission areas EA may display various colors. The black matrix 610 may be disposed side by side with the color filters 620 on the encapsulating element 400. The black matrix 610 may be disposed between the color filters 620. For example, the bank insulating layer 160 between the light-emitting devices 300 may overlap the black matrix 610. The black matrix 610 may be disposed between the emission areas EA and the transmission areas TA. Therefore, in the display panel DP of the transparent touch display apparatus according to the embodiment of the present disclosure, the deterioration of the image due to light leakage may be prevented. The black matrix 610 and the color filters 620 may be disposed outside the transmission areas TA. Thereby, in the display panel DP of the transparent touch display apparatus according to the embodiment of the present disclosure, decreasing the transmittance due to the black matrix 610 and the color filters 620 may be prevented. The first link wires 550 and the second link wires 520 are disposed between the emission areas EA and the transmission areas TA. As such, the black matrix 610 may overlap the first link wires 550 and the second link wires 520.

A cover insulating layer 650 may be disposed on the black matrix 610 and the color filters 620. The cover insulating layer 650 may prevent the damage of the black matrix 610 and the color filters 620 due to the external impact. For example, the cover insulating layer 650 may completely cover the black matrix 610 and the color filters 620. The cover insulating layer 650 may include an insulating material. For example, the cover insulating layer 650 may include an organic insulating material. A thickness difference due to the black matrix 610 and the color filters 620 may be removed by the cover insulating layer 650. For example, an upper surface of the cover insulating layer 650 opposite to the device substrate 100 may be a flat surface.

A cover substrate 700 may be disposed on the cover insulating layer 650. The cover substrate 700 may mitigate the external impact and block the penetration of the moisture. The cover substrate 700 may include a transparent material. For example, the cover substrate 700 may include glass or plastic. The cover substrate 700 may be attached to the upper surface of the cover insulating layer 650. For example, a transparent adhesive layer may be disposed between the cover insulating layer 650 and the cover substrate 700. The transparent adhesive layer may include an adhesive material. The transparent adhesive layer may include a transparent material. For example, the transparent adhesive layer may include optical clear adhesive (OCA).

A reflection preventing layer 800 may be disposed on the cover substrate 700. The reflection preventing layer 800 may prevent the reflection of the external light. For example, the reflection preventing layer 800 may include a low-reflection material. Thus, in the display panel DP of the transparent touch display apparatus according to the embodiment of the present disclosure, the deterioration of the image due to the reflection of the external light may be prevented.

Accordingly, in the transparent touch display apparatus according to the embodiment of the present disclosure, the device substrate 100 may include the emission areas EA on which the light-emitting devices 300 are disposed, and the transmission areas TA disposed outside the emission areas EA, wherein the upper electrode 330 between the bank insulating layer 160 and the encapsulating element 400 may include the first electrode regions 330a which function as the second electrode of each light-emitting device 300 and the second electrode regions 330b which function as the touch electrode. Thus, in the transparent touch display apparatus according to the embodiment of the present disclosure, the process may be simplified, the misarrangement of the light-emitting devices 300 and the touch electrode may be prevented, and the reliability for sensing the touch may be improved without the deterioration of the image.

And, in the transparent touch display apparatus according to the embodiment of the present disclosure, the first link wires 550 applying a voltage to the first electrode region 330a of each light-emitting device 300 and the second link wires 520 respectively connected to the second electrode regions 330b may be disposed between the device substrate 100 and the lower over-coat layer 140. Thus, in the transparent touch display apparatus according to the embodiment of the present disclosure, the process of forming the first link wires 550 and the second link wires 520 may be simplified, and an area occupied by the first link wires 550 and the second link wires 520 may be minimized or reduced. Therefore, in the transparent touch display apparatus according to the embodiment of the present disclosure, a size of the emission areas EA and the transmission areas TA may be maximized or increased.

The transparent touch display apparatus according to the embodiment of the present disclosure is described that each of the first electrode regions 330a and the second electrode regions 330b is in contact with a single point of the corresponding upper intermediate link wire 522 and 552. However, in the transparent touch display apparatus according to another embodiment of the present disclosure, the first upper contact holes and the second upper contact holes may extend along the separating partition 175. For example, in the transparent touch display apparatus according to another embodiment of the present disclosure, each of the first upper contact holes may extend in the second direction between the emission areas EA and the transmission areas TA along the separating partition 175, and each of the second upper contact holes may surround the corresponding second electrode region 330b along the separating partition 175. Thus, in the transparent touch display apparatus according to another embodiment of the present disclosure, a region in which each of the electrode regions 330a and 330b contacts the corresponding upper intermediate link 522 and 552 may have a shape extending along the separating partition 175. Therefore, in the transparent touch display apparatus according to another embodiment of the present disclosure, each of the electrode regions 330a and 330b may be stably connected to the corresponding upper intermediate link 522 and 552.

Figure 4:
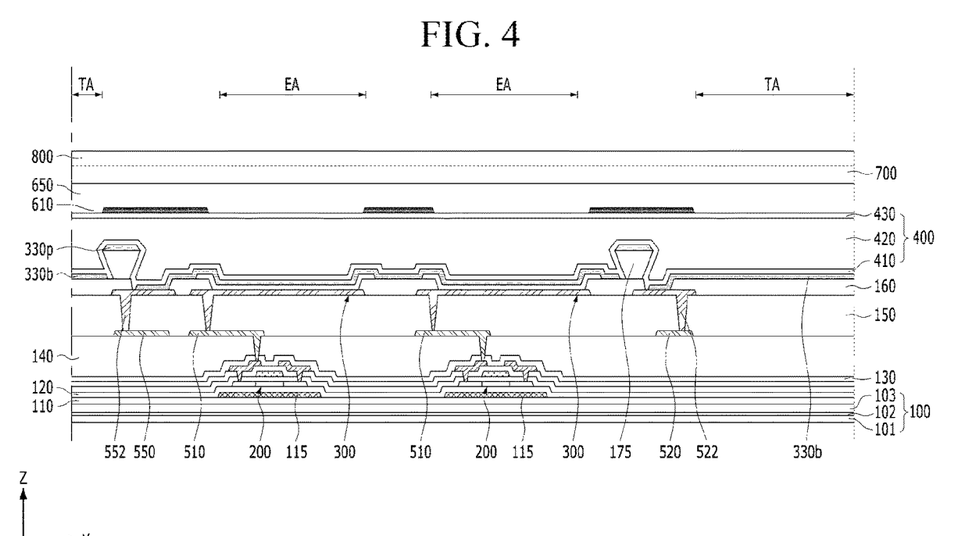
FIGS. 4 to 10 are views showing the transparent touch display apparatus according another embodiment of the present disclosure.

The transparent touch display apparatus according to the embodiment of the present disclosure is described that the first link wires 550 and the second link wires 520 are simultaneously formed with the light-blocking pattern 115. However, in the transparent touch display apparatus according to another embodiment of the present disclosure, the first link wires 550 and the second link wires 520 may be simultaneously formed with one of conductive layers which is disposed between the first buffer layer 110 and the bank insulating layer 160. Also, the transparent touch display apparatus according to another embodiment of the present disclosure may include additional conductive layer for the first link wires 550 and the second link wires 520. For example, in the transparent touch display apparatus according to another embodiment of the present disclosure, an upper over-coat layer 150 may be disposed between the lower over-coat layer 140 and the light-emitting devices 300, and the first link wires 550 and the second link wires 520 may be disposed between the lower over-coat layer 140 and the upper over-coat layer 150, as shown in FIG. 4. The upper over-coat layer 150 may include an insulating material. For example, the upper over-coat layer 150 may include an organic insulating material. A thickness difference due to the first link wires 550 and the second link wires 520 may be removed by the upper over-coat layer 150. The upper over-coat layer 150 may include the same material as the lower over-coat layer 140. For example, an upper surface of the upper over-coat layer 150 toward the light-emitting devices 300 may be a flat surface. Each of the first link wires 550 may be electrically connected to the corresponding first electrode region 330a of the upper electrode 330 by one of the first upper intermediate links 552. Each of the second link wires 520 may be electrically connected to the corresponding second electrode region 330b of the upper electrode 330 by one of the second upper intermediate links 522.

Connecting electrodes 510 may be disposed between the lower over-coat layer 140 and the upper over-coat layer 150. The connecting electrodes 510 may include a conductive material. For example, the connecting electrode 510 may include a metal, such as aluminum (Al), titanium (Ti), copper (Cu), chrome (Cr), molybdenum (Mo) and tungsten (W). The first link wires 550 and the second link wires 520 may include the same material as the connecting electrodes 510. Each of the connecting electrodes 510 may penetrate the lower over-coat layer 140 to connect the drain electrode 260 of one of the thin film transistors 200. For example, the pixel electrode 310 of each light-emitting device 300 may be connected to the corresponding thin film transistor 200 by one of the connecting electrodes 510. Each of the connecting electrodes 510 may include a portion overlapping with the drain electrode 260 of one of the thin film transistors 200 and a portion overlapping with the pixel electrode 310 of one of the light-emitting devices 300. For example, the pixel electrode 310 of each light-emitting devices 300 may be connected to the corresponding connecting electrode 510 by penetrating the upper over-coat layer 150.

The first link wires 550 and the second link wires 520 may be spaced away from the connecting electrodes 510. The first link wires 550 and the second link wires 520 may include the same material as the connecting electrodes 510. Thus, in the transparent touch display apparatus according to another embodiment of the present disclosure, a resistance of the first link wires 550 and the second link wires 520 may be minimized or reduced. Therefore, in the transparent touch display apparatus according to another embodiment of the present disclosure, the reliability of sensing the touch may be improved.

Figure 5:
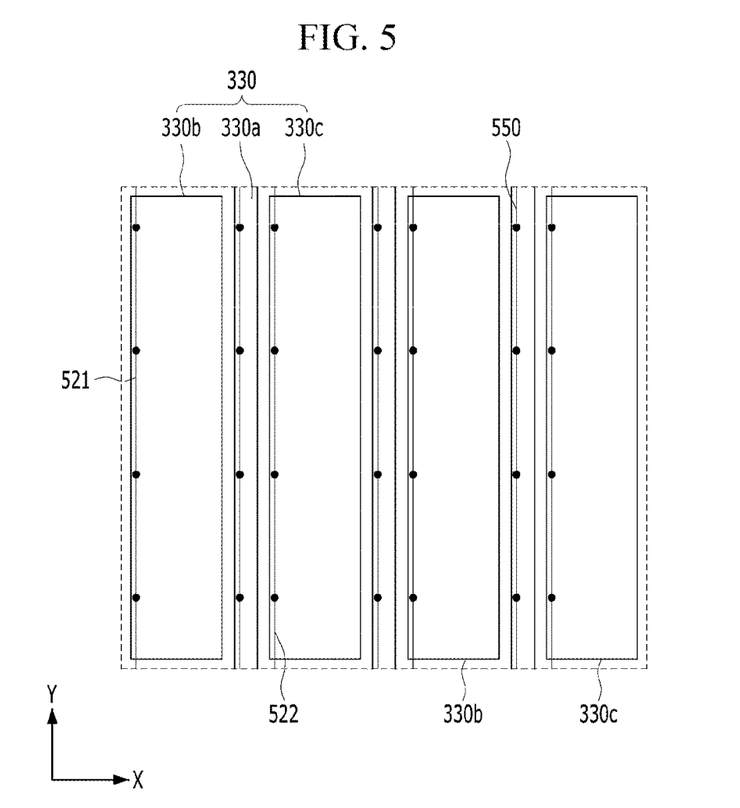

The transparent touch display apparatus according to the embodiment of the present disclosure is described that the touch of the user and/or the tool is sensed in a self-capacitance method by using the second electrode regions 330b which have a block shape on each transmission area TA. However, the transparent touch display apparatus according to the embodiment of another embodiment of the present disclosure may sense the touch of the user and/or the tool in mutual capacitance method. For example, in the transparent touch display apparatus according to another embodiment of the present disclosure, the upper electrode 330 may include first electrode regions 330a connected to the first link wire 550, the second electrode regions 330b connected to the second link wire 520 and third electrode regions 330c connected to a third link wire 522, wherein the first electrode regions 330a, the second electrode regions 330b and the third electrode region 330c, which are spaced away from each other in the first direction X, may extend parallel to each other in the second direction Y perpendicular to the first direction X. Each of the first electrode regions 330a may overlap the emission areas of the device substrate. The second electrode regions 330b and the third electrode regions 330c may be disposed on the transmission areas of the device substrate. For example, each of the first electrode regions 330a may be disposed between one of the second electrode regions 330b and one of the third electrode regions 330c. The third link wires 522 may include a metal, such as aluminum (Al), silver (Ag) and copper (Cu). The third link wires 522 may include the same material as the second link wires 521. The third link wires 522 may be disposed on the same layer as the second link wires 521. For example, the third link wires 522 may be disposed between the first buffer layer 110 and the second buffer layer 120. The third link wires 522 may include the same material as the light-blocking pattern. The third link wires 522 may extend in the second direction Y. For example, the third link wires 522 may be spaced away from the first link wires 550, the second link wires 521 and the light-blocking pattern 115.

The second electrode regions 330b may be insulated from the third link wires 522. The third electrode regions 330c may be insulated from the second link wires 521. A signal applied to the third link wires 522 may be different from a signal applied to the second link wires 521. For example, a touch driving signal Tx may be applied to the second electrode regions 330b, and a touch sensing signal Rx may be applied to the third electrode regions 330c. That is, in the transparent touch display apparatus according to another embodiment of the present disclosure, the electrode regions 330b and 330c of the upper electrode 330 which function as the touch electrode on the transmission areas TA may be divided into a first group applying the touch driving signal Tx and a second group applying the touch sensing signal Rx. Thus, in the transparent touch display apparatus according to another embodiment of the present disclosure, the touch of the user and/or the tool may be sensed by the second electrode regions 330b connected to the second link wires 521 and the third electrode regions 330c connected to the third link wires 522. Therefore, in the transparent touch display apparatus according to the embodiment of the present disclosure, the degree of freedom for touch sensing method may be improved.

Figure 6:
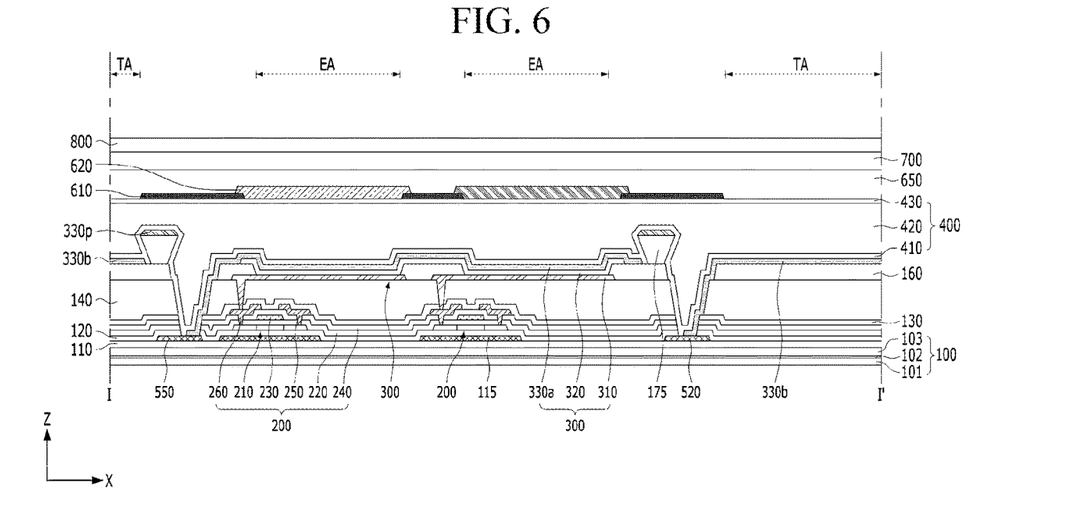
Figure 7:
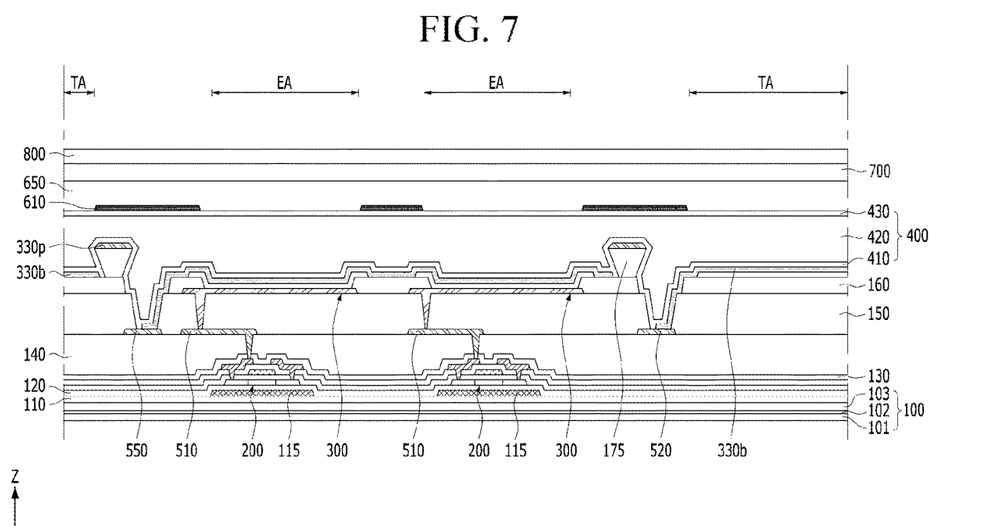

The transparent touch display apparatus according to the embodiment of the present disclosure is described that each of the link wires 520 and 550 is connected to the corresponding electrode region 330a and 330b by the intermediate links 521, 522, 551 and 552. However, in the transparent touch display apparatus according to another embodiment of the present disclosure, each of the electrode regions 330a and 330b may be in direct contact with the corresponding link wire 520 and 550 under the separating partition 175, as shown in FIGS. 6 and 7. Thus, in the transparent touch display apparatus according to another embodiment of the present disclosure, the process efficiency may be effectively improved.

Figure 8:
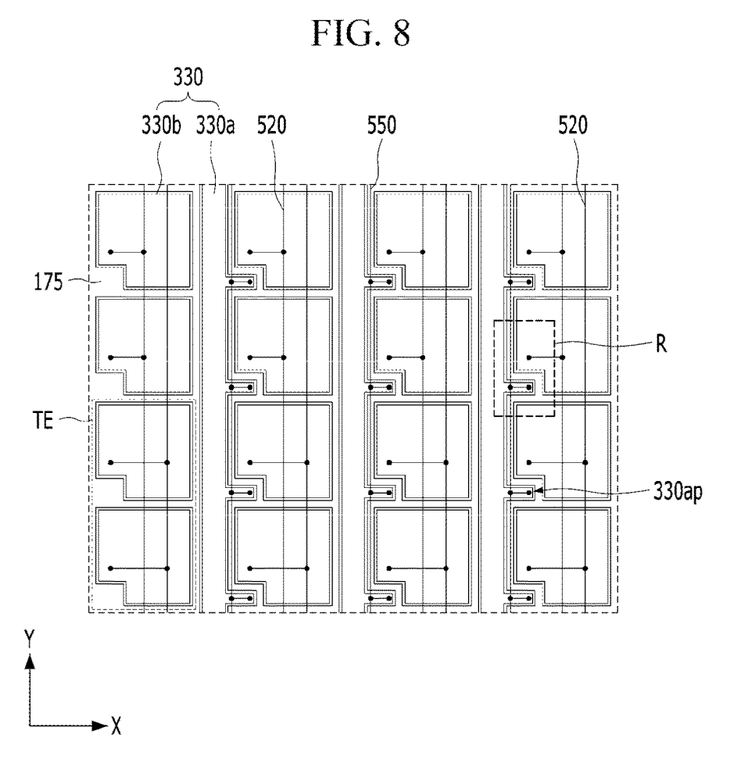
Figure 9:
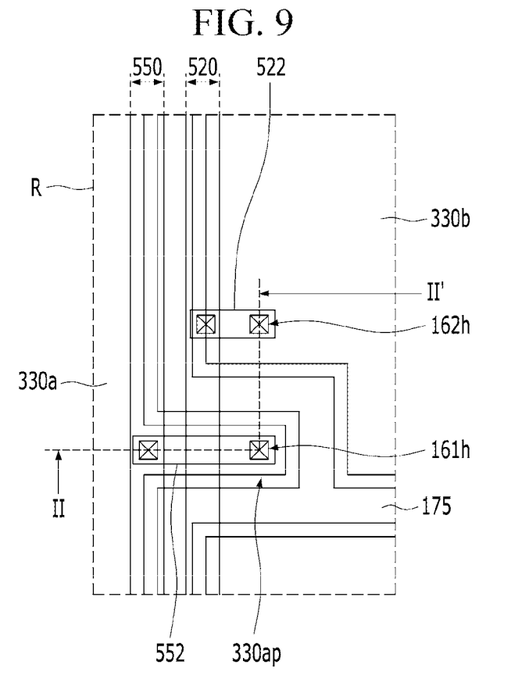
Figure 10:
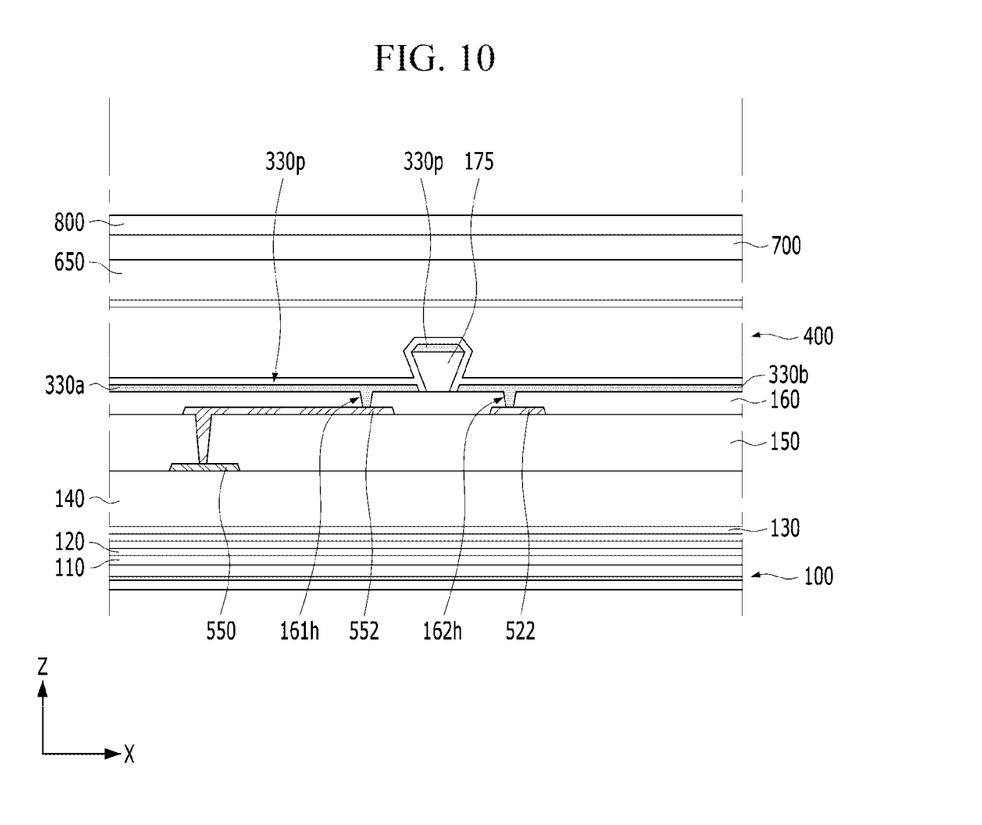

The transparent touch display apparatus according to the embodiment of the present disclosure is described that an end of each electrode region 330a and 330b divided by the separating partition 175 may be connected to the corresponding upper intermediate link 522 and 552. However, in the transparent touch display apparatus according to another embodiment of the present disclosure, each of the electrode regions 330a and 330b may be connected to the corresponding upper intermediate link 522 and 552 by one of intermediate contact holes which are disposed outside the separating partition 175. For example, in the transparent touch display apparatus according to another embodiment of the present disclosure, each first electrode region 330a of the upper electrode 330 may include a protruding region 330ap extending in the first direction X, and the bank insulating layer 160 may include first intermediate contact holes 161h overlapping with the protruding region 330ap of each first electrode region 330a, as shown in FIGS. 8 to 10. Each of the first intermediate contact holes 161h may partially expose one of the first upper intermediate links 552. The protruding region 330ap of each first electrode region 330a may include a portion overlapping with the corresponding first upper intermediate link 552. For example, the protruding region 330ap of each first electrode region 330a may be connected to the first upper intermediate link 552 by one of the first intermediate contact holes 161h. Thus, in the transparent touch display apparatus according to another embodiment of the present disclosure, the degree of freedom for connecting method between each first electrode region 330a and the corresponding first link wire 550 may be improved.

The protruding region 330ap of each first electrode region 330a may include a portion overlapping with one of the transmission areas of the device substrate 100. For example, the protruding region 330ap of each first electrode region 330a may be disposed between the second electrode regions 330b, which are disposed on each transmission area. Each of the second electrode regions 330b may include a recess region for the location of the protruding region 330ap.

The bank insulating layer 160 may include second intermediate contact holes 162h for connecting each second electrode region 330b to one of the second upper intermediate links 522. The second intermediate contact holes 162h may be disposed side by side with the first intermediate contact holes 161h in the second direction Y. Thus, in the transparent touch display apparatus according to another embodiment of the present disclosure, a size of the emission areas and/or the transmission areas reduced by the first intermediate contact holes 161h and the second intermediate contact holes 162h may be minimized or reduced. Therefore, in the transparent touch display apparatus according to another embodiment of the present disclosure, a size of the emission areas and the transmission areas may be maximized or increased.

In the result, the transparent touch display apparatus according to the embodiments of the present disclosure may include the light-emitting device on the emission area of the device substrate and the touch electrode on the transmission area of the device substrate, wherein the touch electrode may include the same material as the second electrode of the light-emitting device, the first link wire electrically connected to the second electrode of the light-emitting device and the second link wire electrically connected to the touch electrode may be disposed between the device substrate and the light-emitting device and/or the device substrate and the touch electrode. Thus, in the transparent touch display apparatus according to the embodiments of the present disclosure, the misarrangement of the light-emitting device and the touch electrode may be prevented, and an area occupied by the first link wires and the second link wire may be minimized or reduced. Thereby, in the transparent touch display apparatus according to the embodiments of the present disclosure, the process efficiency may be improved, and the reliability for touch sensing may be increased without the deterioration of the image.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A transparent touch display apparatus, comprising:
  a device substrate including an emission area and a transmission area;
  an over-coat layer on the emission area and the transmission area of the device substrate;
  a pixel electrode on the over-coat layer of the emission area;
  a bank insulating layer covering an edge of the pixel electrode;
  an upper electrode on the bank insulating layer, the upper electrode including:
    a first electrode region overlapping with the emission area; and
    a second electrode region overlapping with the transmission area;
  a light-emitting layer between a portion of the pixel electrode exposed by the bank insulating layer and the first electrode region of the upper electrode;
  an encapsulating element on the first electrode region and the second electrode region of the upper electrode;
  a first link wire between the device substrate and the over-coat layer, the first link wire being electrically connected to the first electrode region of the upper electrode;
  a second link wire being spaced away from the first link wire, the second link wire being electrically connected to the second electrode region of the upper electrode;
  a color filter on the encapsulating element, the color filter overlapping with the emission area; and
  a black matrix disposed side by side with the color filter on the encapsulating element,
  wherein the color filter and the black matrix are disposed outside the transmission area, and
  wherein the second electrode region of the upper electrode is spaced away from the first electrode region of the upper electrode.

2. The transparent touch display apparatus according to claim 1, further comprising a separating partition on the bank insulating layer, the separating partition including a side having a shape of reverse taper,
   wherein the separating partition is disposed between the first electrode region and the second electrode region of the upper electrode.

3. The transparent touch display apparatus according to claim 2, wherein the separating partition is disposed between the emission area and the transmission area.

4. The transparent touch display apparatus according to claim 1, wherein the second electrode region of the upper electrode includes the same material as the first electrode region of the upper electrode.

5. The transparent touch display apparatus according to claim 1, wherein the second link wire includes the same material as the first link wire.

6. The transparent touch display apparatus according to claim 5, wherein the second link wire is disposed on the same layer as the first link wire.

7. The transparent touch display apparatus according to claim 5, further comprising:
   a thin film transistor between the device substrate and the over-coat layer, the thin film transistor being electrically connected to the pixel electrode; and
   a light-blocking pattern between the device substrate and a semiconductor pattern of the thin film transistor,
   wherein the first link wire and the second link wire are disposed on the same layer as the light-blocking pattern.

8. The transparent touch display apparatus according to claim 1, wherein the second electrode region of the upper electrode is disposed side by side with the first electrode region of the upper electrode in a first direction, and
   wherein the first electrode region of the upper electrode extends in a second direction perpendicular to the first direction.

9. The transparent touch display apparatus according to claim 8, wherein the upper electrode further includes a third electrode region being spaced away from the first electrode region and the second electrode region,
   wherein the first electrode region is disposed between the second electrode region and the third electrode region,
   wherein the third electrode region is electrically connected to a third link wire which is spaced away from the first link wire and the second link wire, and
   wherein the second electrode region and the third electrode region extend in the second direction.

10. A transparent touch display apparatus, comprising:
    a light-emitting device on an emission area of a device substrate, the light-emitting device including a first electrode, a light-emitting layer and a second electrode, which are sequentially stacked;
    a touch electrode on a transmission area of the device substrate, the touch electrode including the same material as the second electrode of the light-emitting device;
    an upper over-coat layer, the upper over-coat layer being between the device substrate and the first electrode of the light-emitting device, and between the device substrate and the touch electrode;
    a first link wire between the device substrate and the upper over-coat layer, the first link wire being electrically connected to the second electrode of the light-emitting device;
    a second link wire between the device substrate and the upper over-coat layer, the second link wire being electrically connected to the touch electrode;
    a thin film transistor between the device substrate and the upper over-coat layer, the thin film transistor being electrically connected to the first electrode of the light-emitting device; and
    a lower over-coat layer between the thin film transistor and the upper over-coat layer,
    wherein the first link wire and the second link wire are disposed between the lower over-coat layer and the upper over-coat layer, and
    wherein the second link wire extends parallel to the first link wire.

11. The transparent touch display apparatus according to claim 10, further comprising an encapsulating element on the second electrode of the light-emitting device and the touch electrode.

12. The transparent touch display apparatus according to claim 10, further comprising a connecting electrode between the lower over-coat layer and the upper over-coat layer, the connecting electrode connecting the first electrode of the light-emitting device to the thin film transistor,
    wherein the first link wire and the second link wire include the same material as the connecting electrode.

13. The transparent touch display apparatus according to claim 10, further comprising:
    a bank insulating layer covering an edge of the first electrode, the bank insulating layer extending between the upper over-coat layer and the touch electrode;
    a first intermediate link between the upper over-coat layer and the bank insulating layer, the first intermediate link electrically connecting the second electrode of the light-emitting device to the first link wire; and
    a second intermediate link between the upper over-coat layer and the bank insulating layer, the second intermediate link electrically connecting the touch electrode to the second link wire,
    wherein the first intermediate link and the second intermediate link include the same material as the first electrode of the light-emitting device.

14. The transparent touch display apparatus according to claim 13, wherein the touch electrode is disposed side by side with the second electrode of the light-emitting device in a first direction;
    wherein the second electrode of the light-emitting device extends in a second direction perpendicular to the first direction,
    wherein the second electrode includes a protruding region which is extended in the first direction at the outside of the touch electrode, and
    wherein the first intermediate link is electrically connected to the protruding region of the second electrode.

15. The transparent touch display apparatus according to claim 14, wherein the bank insulating layer includes a first intermediate contact hole exposing at least a portion of the first intermediate link, and a second intermediate contact hole exposing at least a portion of the second intermediate link, and
    wherein the second intermediate contact hole is disposed side by side with the first intermediate contact hole in the second direction.

16. A transparent touch display apparatus, comprising:
    a light-emitting device on an emission area of a device substrate;
    a touch electrode on a transmission area of the device substrate, the touch electrode including the same material as an upper electrode of the light-emitting device;

an upper over-coat layer, the upper over-coat layer being between the device substrate and a pixel electrode of the light-emitting device;

a first link wire between the device substrate and the upper over-coat layer, the first link wire being in contact with the upper electrode of the light-emitting device through the upper over-coat layer;

a second link wire between the device substrate and the upper over-coat layer, the second link wire being in contact with the touch electrode through the upper over-coat layer, and being in the same layer as the first link wire; and a black matrix, wherein the first link wire and the second link wire are overlapped by the black matrix.

17. The transparent touch display apparatus of claim 16, further comprising:

a lower over-coat layer, the lower over-coat layer being between the device substrate and the upper over-coat layer;

wherein the first link wire and the second link wire are between the lower over-coat layer and the upper over-coat layer.

\* \* \* \* \*